(12) United States Patent
Kim

(10) Patent No.: US 8,674,379 B2
(45) Date of Patent: Mar. 18, 2014

(54) LIGHT-EMITTING DEVICE PACKAGE AND METHOD OF MANUFACTURING THE SAME

(71) Applicant: Samsung Electronics Co., Ltd., Suwon-si (KR)

(72) Inventor: Hyung-kun Kim, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 13/935,431

(22) Filed: Jul. 3, 2013

(65) Prior Publication Data
US 2013/0285085 A1    Oct. 31, 2013

Related U.S. Application Data

(63) Continuation of application No. 13/325,666, filed on Dec. 14, 2011, now Pat. No. 8,502,240.

(30) Foreign Application Priority Data

Dec. 24, 2010    (KR) ........................ 10-2010-0134910

(51) Int. Cl.
*H01L 29/18* (2006.01)

(52) U.S. Cl.
USPC ................. 257/88; 257/27; 257/89; 257/91; 257/98; 438/15; 438/26; 438/27; 438/29; 438/33

(58) Field of Classification Search
None
See application file for complete search history.

(56) References Cited

U.S. PATENT DOCUMENTS 7,598,528 B2    10/2009    Oh et al.
2006/0158881 A1 *    7/2006    Dowling ........................ 362/231

FOREIGN PATENT DOCUMENTS

KR    10-2008-0034574 A    4/2008
KR    10-2009-0078912 A    7/2009

* cited by examiner

*Primary Examiner* — Kyoung Lee
(74) *Attorney, Agent, or Firm* — McDermott Will & Emery LLP

(57) ABSTRACT

Provided are a light-emitting device package and a method of manufacturing the same. The light-emitting device package may include a plurality of light-emitting chips on one substrate (board). The plurality of light-emitting chips may produce colors around a target color. The target color may be produced by combinations of the colors of light emitted from the plurality of light-emitting chips. The colors around the target color may have the same hue as the target color and have color temperatures different from that of the target color. The plurality of light-emitting chips may have color temperatures within about ±250K of that of the target color.

17 Claims, 9 Drawing Sheets

LIGHT-EMITTING DEVICE PACKAGE AND METHOD OF MANUFACTURING THE SAME

CROSS-REFERENCE TO RELATED APPLICATIONS

This application is a Continuation of U.S. application Ser. No. 13/325,666, filed on Dec. 14, 2011, which claims the benefit of Korean Patent Application No. 10-2010-0134910, filed on Dec. 24, 2010, in the Korean Intellectual Property Office, the disclosures of which are incorporated herein in their entirety by reference.

BACKGROUND

1. Field

The present disclosure relates to light-emitting device packages and methods of manufacturing the same.

2. Description of the Related Art

Light-emitting devices such as light emitting diodes (LEDs) and laser diodes (LDs) utilize an electroluminescence phenomenon, that is, a phenomenon in which light is emitted from a material (semiconductor) by applying a current or voltage to the material. Light may be emitted from an active layer (i.e., light-emitting layer) due to combinations of electrons and holes within the active layer, and the light may have energy corresponding to an energy band gap of the active layer.

A light-emitting chip may be mounted on a substrate, and then, a fluorescent layer may be coated on the light-emitting chip to manufacture a light-emitting device package. However, it is difficult to reduce a color variation between signal chip packages in a typical method in which the single chip packages are manufactured and are arrayed. Thus, a defective proportion may be increased. In addition, a rigorous production management may be required, process efficiency may be reduced, and production yield may be decreased. That is to say, since it is difficult to reduce the color variation between light-emitting chips due to variations/errors occurring in manufacturing processes according to the typical method, productivity may be reduced.

SUMMARY

Provided are light-emitting device packages which reduce a color variation and improve productivity.

Provided are methods of manufacturing the light-emitting device packages.

Additional aspects will be set forth in part in the description which follows and, in part, will be apparent from the description, or may be learned by practice of the presented embodiments.

According to an aspect of the present invention, a light-emitting device package includes a substrate; and a plurality of light-emitting chips disposed on the substrate, wherein the plurality of light-emitting chips produce colors around a target color, and the colors around the target color have the same hue as the target color and color temperatures different from that of the target color, wherein the target color is produced by combinations of the colors of light emitted from the plurality of light-emitting chips.

The plurality of light-emitting chips may have color temperatures within about ±250K of that of the target color.

The target color may be a color corresponding to a central portion of a predetermined rank region.

At least four light-emitting chips may be provided.

The plurality of light-emitting chips may be arranged in a checkerboard pattern form.

The plurality of light-emitting chips may be arranged in an N×N matrix, where N is a natural number equal to or greater than two.

Each of the plurality of light-emitting chips may include an independent fluorescent layer.

The light-emitting device package may be a white light-emitting device package.

According to another aspect of the present invention, a method of manufacturing a light-emitting device package includes forming a light emitting structure layer including a plurality of light-emitting cell regions on a wafer; forming a fluorescent layer covering the plurality of light-emitting cell regions on the wafer; separating the wafer on which the plurality of light-emitting cell regions and the fluorescent layer are formed into a cell unit to form a plurality of light-emitting chips; classifying the plurality of light-emitting chips according to color temperatures thereof; and selecting a plurality of chips among the plurality of light-emitting chips and packaging the selected light-emitting chips on a substrate, wherein the selected light-emitting chips produce colors around a target color.

The selected light-emitting chips may have color temperatures within about ±250K of that of the target color.

The target color may be a color corresponding to a central portion of a predetermined rank region.

At least four light-emitting chips may be selected to be packaged on the substrate.

The selected light-emitting chips may be arranged on the substrate in a checkerboard pattern form.

The plurality of light-emitting chips may be white light-emitting chips.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Figure 1:
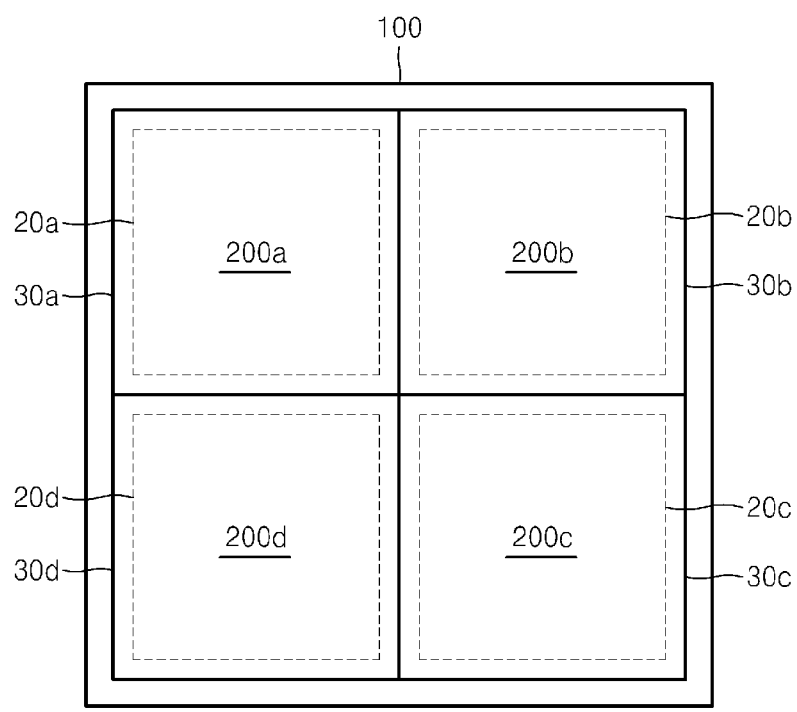
FIG. 1 is a plan view of a light-emitting device package according to an embodiment.

Various example embodiments will now be described more fully with reference to the accompanying drawings in which example embodiments are shown.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, a light-emitting device package and a method of manufacturing the same according to an embodiment will be described in detail with reference to the accompanying drawings. In the figures, the dimensions of layers and regions are exaggerated for clarity of illustration. Like reference numerals refer to like elements throughout.

FIG. 1 is a plan view of a light-emitting device package according to an embodiment.

Referring to FIG. 1, a plurality of light-emitting chips, e.g., four light-emitting chips $200a$ to $200d$ may be disposed on a substrate 100. The substrate may be a printed circuit board (PCB) substrate. The light-emitting chips $200a$ to $200d$ may include light-emitting cells $20a$ to $20d$ and fluorescent layers $30a$ to $30d$ covering the light-emitting cells $20a$ to $20d$, respectively. The light-emitting chips $200a$ to $200d$ may be chips producing colors around a predetermined target color. The colors around the target color may be equal to the target color in hue, but different from the target color in color temperature. For example, the plurality of light-emitting chips $200a$ to $200d$ may have a color temperature within about ±250K of that of the target color. A color temperature relationship between the colors of light emitted from the light-emitting chips $200a$ to $200d$ and the target color will be described later in detail. The light-emitting device package may produce the target color by combinations of the colors of light emitted from the light-emitting chips $200a$ to $200d$. Although each of the light-emitting chips $200a$ to $200d$ has a color temperature which is somewhat away from that of the target color, the target color may be realized by the combinations of the colors of light emitted from the light-emitting chips $200a$ to $200d$, which will be described later in detail.

The light-emitting chips $200a$ to $200d$ may be arranged in a checkerboard pattern form. For example, the light-emitting chips $200a$ to $200d$ may be arranged in a 2×2 matrix. However, the number of light-emitting chips may be increased to more than four. In this case, the light-emitting chips may be arranged in a 3×3 or 4×4 matrix. That is, the light-emitting chips may be arranged in an N×N matrix, where N may be a natural number equal to or greater than two.

For example, the light-emitting device package of FIG. 1 may be a white light-emitting device package. In this case, the light-emitting cells $20a$ to $20d$ may be blue light-emitting cells. The fluorescent layers $30a$ to $30d$ may be layers formed of a yellow fluorescent material. Alternatively, the light-emitting cells $20a$ to $20d$ may be ultraviolet ray emitting cells, and the fluorescent layers $30a$ to $30d$ may be layers in which RGB (red, green, and blue) fluorescent materials are mixed. The light-emitting cells $20a$ to $20d$ and the fluorescent layers $30a$ to $30d$ may be combined with each other to generate white light. However, colors of light emitted from the light-emitting cells $20a$ to $20d$ and colors of the fluorescent layers $30a$ to $30d$ are not limited to the above-described embodiment. If the white light is emitted by the combinations of the light-emitting cells $20a$ to $20d$ and the fluorescent layers $30a$ to $30d$, the colors of the two elements may be variously changed. Also, the light-emitting device package according to an embodiment may emit light of a color different from the white color.

Although not shown in FIG. 1, an encapsulation material covering the fluorescent layers $30a$ to $30d$ may be further disposed on the substrate 100, and then, a lens may be disposed on the encapsulation material. The encapsulation material may include silicon containing a dispersing agent, for example.

Figure 2:
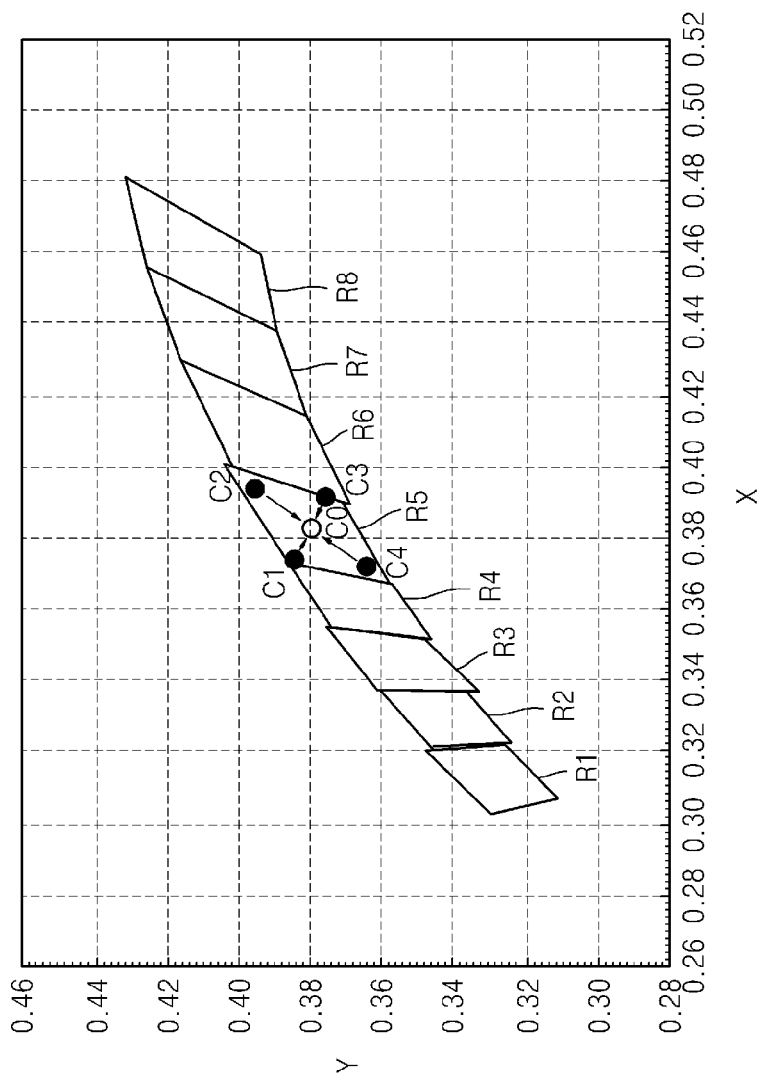
FIGS. 2 to 4 are color coordinates illustrating examples of a relationship between colors of light emitted from a plurality of light-emitting chips and a target color in the light-emitting device package of FIG. 1.
Figure 3:
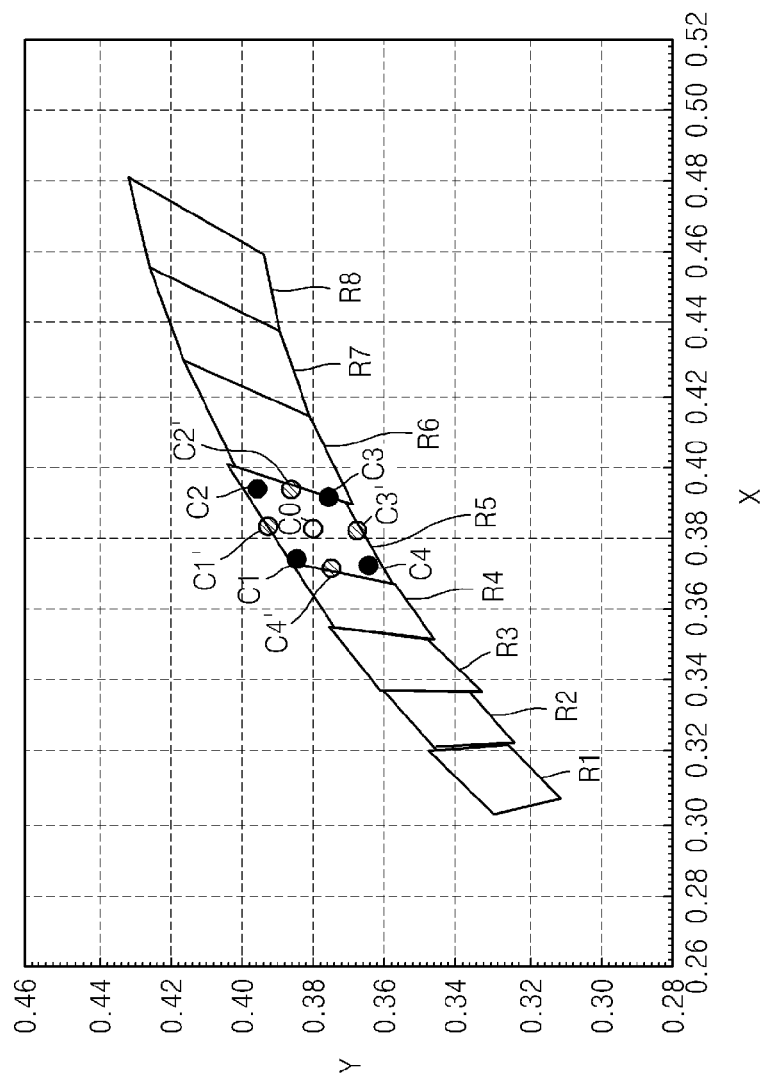
Figure 4:
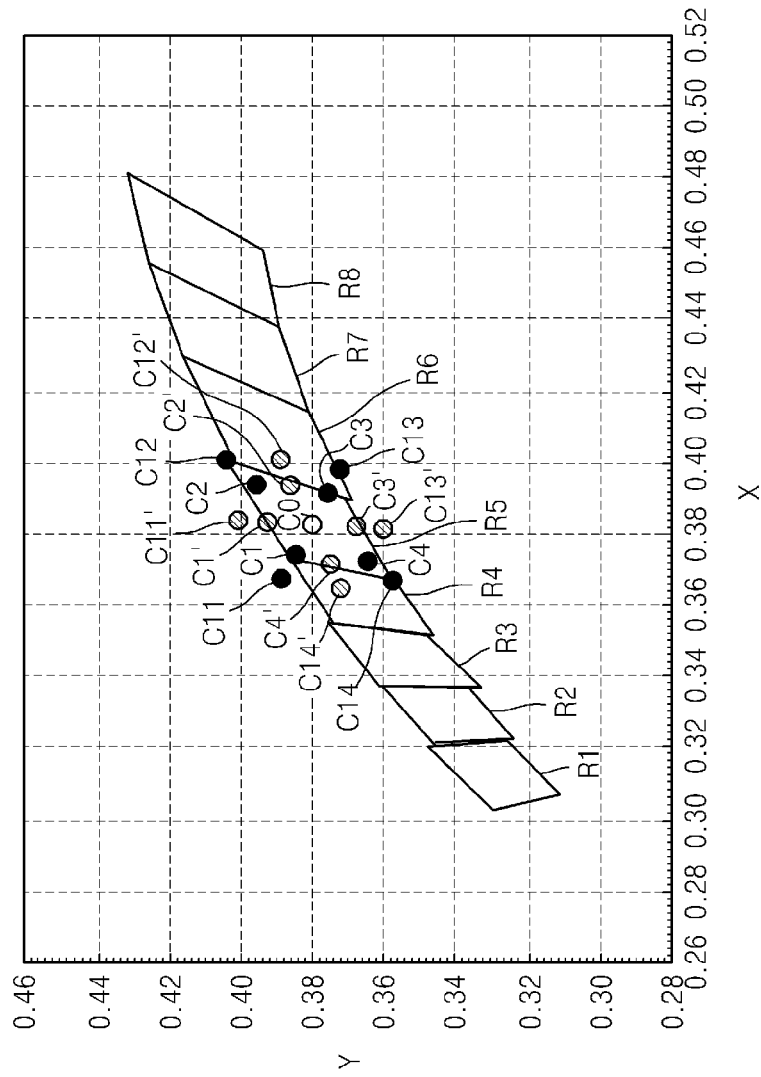

FIGS. 2 to 4 are color coordinates illustrating examples of a relationship between colors of light emitted from a plurality of light-emitting chips and a target color in the light-emitting device package of FIG. 1. In FIGS. 2 to 4, the light-emitting device package according to an embodiment emits white light.

Referring to FIG. 2, a white region in the color coordinate may be divided into a plurality of rank regions R1 to R8. The plurality of rank regions R1 to R8 have the same color (hue) as each other, but have color temperatures and brightnesses different from each other. That is, the white region in the color coordinate may be divided into the plurality of rank regions R1 to R8 according to a color temperature and brightness. The target color described in FIG. 1 may be a central portion C0 of a predetermined rank region R5, and the plurality of light-emitting chips 200a to 200d may be chips respectively producing first, second, third, and fourth colors C1, C2, C3, and C4 around the target color C0 (i.e., the central portion of the rank region R5). The plurality of light-emitting chips 200a to 200d may correspond to the surrounding colors C1 to C4 respectively. The surrounding colors C1 to C4 corresponding to the plurality of light-emitting chips 200a to 200d, respectively, may be spaced from the target color C0 with similar distances.

As described above, when the light-emitting device package is constituted by a multi-chip package, an intermediate color of the colors C1 to C4 respectively produced by the plurality of light-emitting chips 200a to 200d, i.e., the target color C0, may be generated. Although each of the plurality of light-emitting chips 200a to 200d has a color temperature which is somewhat away from that of the target color C0, since the target color C0 may be realized by the combinations of the colors of light emitted from the plurality of light-emitting chips 200a to 200d, problems of the color variation between the chips may be solved. Therefore, the desired color may be easily realized. Furthermore, since chips classified as defective chips in a related art may be used as good chips, a defective proportion may be reduced and production yield may be increased.

Specifically, the first color C1 and the third color C3 of the surrounding colors C1 to C4 corresponding to the plurality of light-emitting chips 200a to 200d may face each other (symmetric relation) with respect to the target color C0, and the second color C2 and the fourth color C4 may face each other (symmetric relation) with respect to the target color C0. Also, when a diamond shaped region (or a semi-diamond shaped region) is defined within about ±250K with respect to the central target color C0, the surrounding colors C1 to C4 may correspond to apexes of the diamond shaped region (or a semi-diamond shaped region) or four colors disposed at about the apexes. When this condition is satisfied, the target color C0 may be easily realized by the plurality of light-emitting chips 200a to 200d.

The colors (positions) of the light-emitting chips 200a to 200d described with reference to FIG. 2 are exemplary merely. Thus, the colors (positions) may be variously changed, as described as follows with reference to FIGS. 3 and 4.

Referring to FIG. 3, if the colors C1 to C4 around the central portion C0 of the rank region R5 are referred to as first group colors C1 to C4, second group colors C1' to C4' may be disposed between the first group colors C1 to C4. The plurality of light-emitting chips 200a to 200d of FIG. 1 may produce the first group colors C1 to C4. Alternatively, the plurality of light-emitting chips 200a to 200d may produce the second group colors C1' to C4'. Also, in some cases, three of the plurality of light-emitting chips 200a to 200d may produce three of the first group colors (three of C1 to C4), and the remaining one of the plurality of light-emitting chips 200a to 200d may produce one of the second group colors (one of C1' to C4'). In this case, the remaining one color may produce a color adjacent to the non-selected color of the first group colors C1 to C4. For example, three of the plurality of light-emitting chips 200a to 200d may produce colors corresponding to the first group colors C1, C2, and C3, and the remaining one may produce a color corresponding to the second group color C3' or C4'.

Referring to FIG. 4, third and fourth group colors C11 to C14 and C11' to C14' may be disposed at positions further away from the target color C0 than the above-described first and second group colors C1 to C4 and C1' to C4'. The plurality of light-emitting chips 200a to 200d of FIG. 1 may be chips having the third group colors C11 to C14 or chips having the fourth group colors C11' to C14'. Alternatively, three of the plurality of light-emitting chips 200a to 200d may produce three of the third group colors C11 to C14 (three of C11 to C14), and the remaining one may produce one of the fourth group colors C11' to C14' (one of C11' to C14'). When the plurality of light-emitting chips 200a to 200d of FIG. 1 are chips producing the third group colors C11 to C14 or the fourth group colors C11' to C14', the colors of the plurality of chips 200a to 200d may be combined to realize the target color C0. Although chips corresponding to the third and fourth group colors C11 to C14 and C11' to C14' are classified as defective chips in the related art, the chips corresponding to the third and fourth group colors C11 to C14 and C11' to C14' may be used as good chips in the current embodiment. As described above, according to an embodiment, since the chips classified as defective chips may be used as good chips, production yield may be improved.

Figure 5:
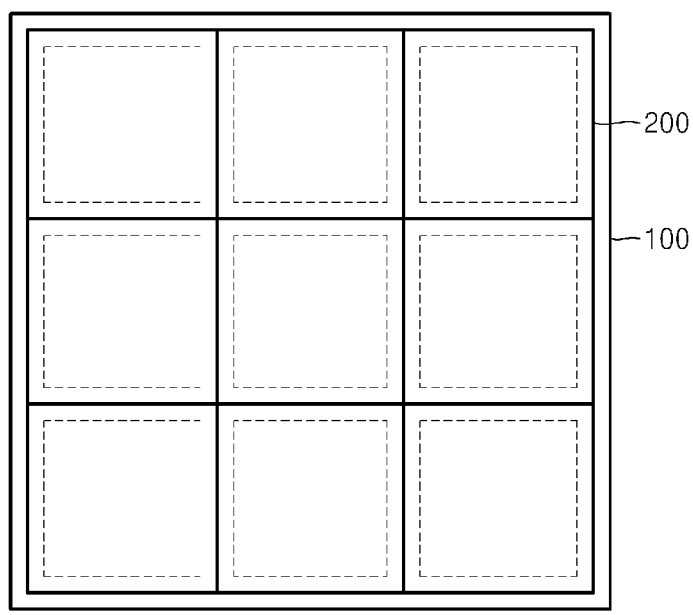
FIGS. 5 and 6 are plan views of a light-emitting device package according to another embodiment.
Figure 6:
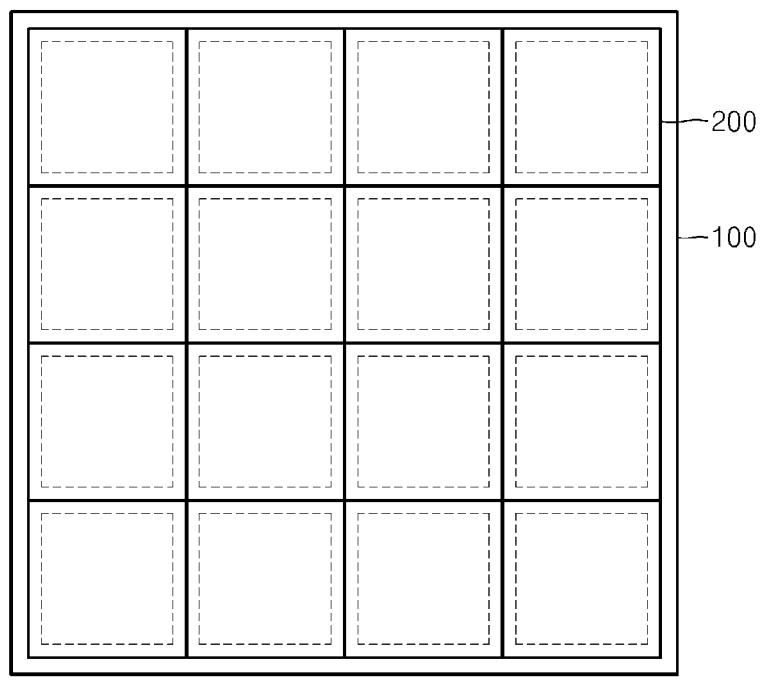

As described above, the number of light-emitting chips may be increased to more than four. In this case, the light-emitting chips may be packaged as a multi-chip package having 3×3 matrix, 4×4 matrix, or the like. An example of the multi-chip package arranged in the 3×3 or 4×4 matrix is illustrated in FIGS. 5 and 6. FIG. 5 illustrates a structure in which the light-emitting chips 200 are arranged in the 3×3 matrix, and FIG. 6 illustrates a structure in which the light-emitting chips 200 are arranged in the 4×4 matrix.

Figure 7A:
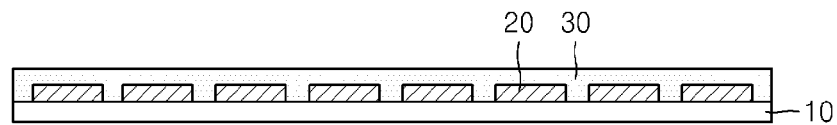
FIGS. 7A to 7D are views illustrating a method of manufacturing a light-emitting device package, according to an embodiment.
Figure 7B:
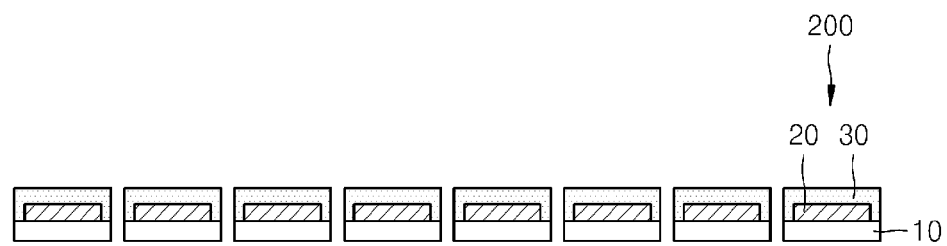
Figure 7C:
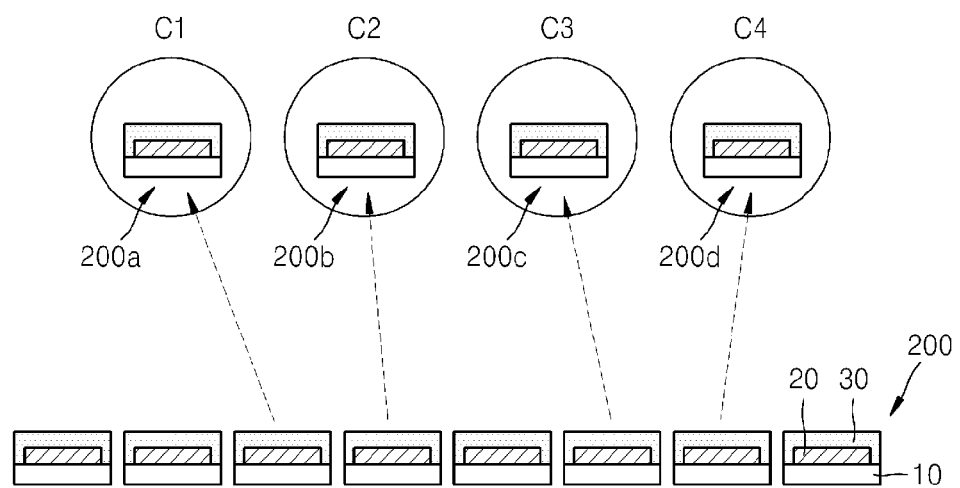
Figure 7D:
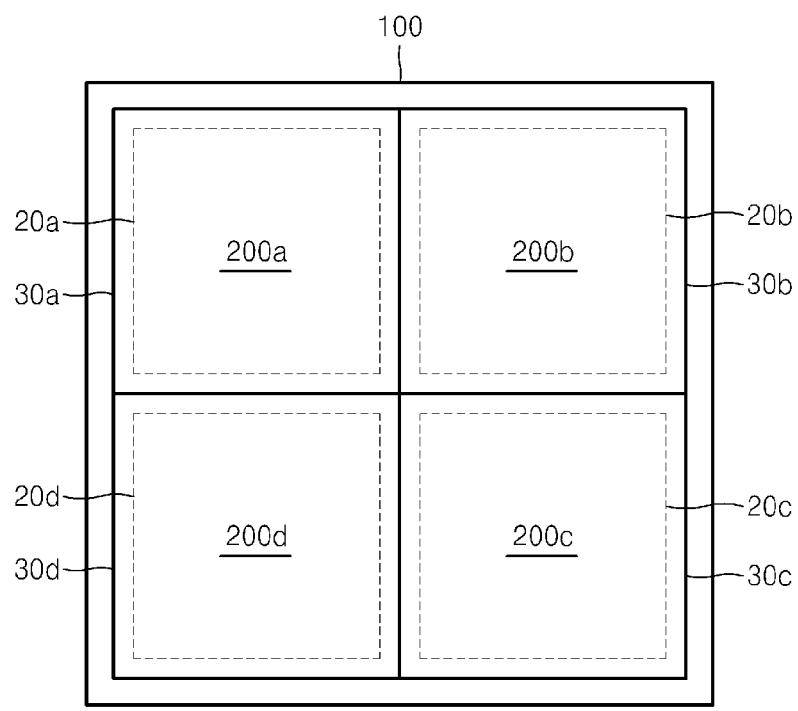

FIGS. 7A to 7D are views illustrating a method of manufacturing a light-emitting device package, according to an embodiment. FIGS. 7A to 7C are sectional views, and FIG. 7D is a plan view.

Referring to FIG. 7A, a plurality of light-emitting cells 20 may be formed on a wafer 10. Although the light-emitting cells 20 are simply illustrated in the drawings, each of the light-emitting cells 20 may include a structure in which a first conductive type semiconductor, an active layer, and a second conductive type semiconductor are sequentially stacked. The first conductive type semiconductor may be an N-type semiconductor, and the second conductive type semiconductor may be a P-type semiconductor, and vice versa. The active layer may be a light-emitting layer in which electrons and holes combine to emit light. Each of the light-emitting cells 20 may further include other material layers than the first conductive type semiconductor layer, the active layer, and the second conductive type semiconductor layer. Also, each of the structures of the light-emitting cells 20 may be variously modified. The plurality of light-emitting cells 20 may be a plurality of light-emitting cell regions, and they may constitute one light emitting structure layer. That is, the plurality of light-emitting cells 20 may be a plurality of light-emitting cell regions of a light emitting structure layer.

A fluorescent layer 30 may be formed on the wafer 10 to cover the plurality of light-emitting cells 20. Since the fluorescent layer 30 is formed at a wafer level, the fluorescent layer 30 may be easily formed with a uniform thickness on the entire wafer 10.

Figure 8:
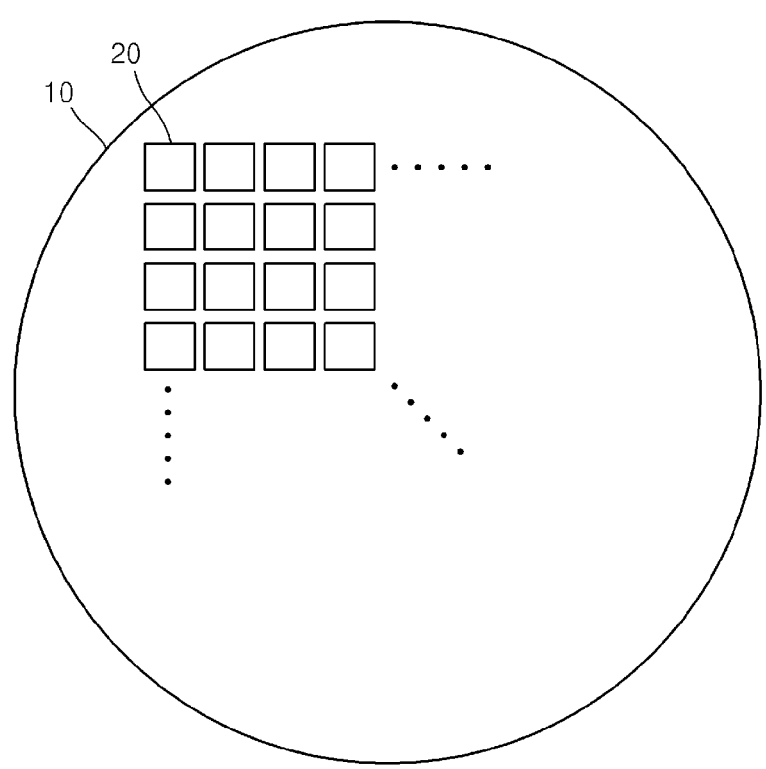
FIG. 8 is a plan view of FIG. 7A.

A top view (plan view) of FIG. 7A may be the same as FIG. 8, for example. The fluorescent layer 30 of FIG. 7A is not illustrated in FIG. 8.

Referring to FIG. 7B, the wafer 10 on which the plurality of light-emitting cells 20 and the fluorescent layer 30 are formed may be divided into a cell unit to form a plurality of light-emitting chips 200. The plurality of light-emitting chips 200 may have a color variation/dispersion due to errors occurring during the product manufacturing process. That is, although the plurality of light-emitting chips 200 have the same color (e.g., white color), the plurality of light-emitting chips 200 may have color temperatures and brightnesses different from each other.

Referring to FIG. 7C, the plurality of light-emitting chips 200 may be classified according to color temperatures. For example, in this process, the plurality of light-emitting chips 200 may be classified into first color groups C1 to C4 according to the color temperatures of the plurality of light-emitting chips 200. Here, the plurality of color groups C1 to C4 may correspond to the four surrounding colors C1 to C4 of FIG. 2. This process may be different from a binning process in an LED manufacturing process.

Referring to FIG. 7D, a plurality of light-emitting chips 200a to 200d may be selected from the plurality of light-emitting chips 200 classified into the plurality of color groups C1 to C4 in the former process to mount the selected light-emitting chips 200a to 200b on one substrate 100. Here, the selected light-emitting chips 200a to 200d may be chips respectively corresponding to the four surrounding colors C1 to C4 of FIG. 2. Thus, the selected light-emitting chips 200a to 200d may produce an intermediate color of the four surrounding colors C1 to C4, i.e., a target color C0. The selected light-emitting chips 200a to 200d may have color temperatures within about ±250K of that of the target color C0. A color temperature relationship between the selected light-emitting chips 200a to 200d and the target color C0 will be described later in detail. Reference numerals 20a to 20d and 30a to 30d of FIG. 7D represent light-emitting cells and fluorescent layers of the selected light-emitting chips 200a to 200d, respectively.

The colors produced by the selected light-emitting chips 200a to 200d in FIG. 7D are not limited to the four surrounding colors C1 to C4 of FIG. 2, but may be variously changed. Since this is already described with reference to FIGS. 3 and 4, a duplicate description thereof will be omitted.

Thereafter, although not shown, an encapsulation material, covering the fluorescent layers 30a to 30d, may be formed on the substrate 100. The encapsulation material may be formed of silicon containing a dispersing agent, for example. A lens may be disposed on the encapsulation material.

As described above, according to the embodiment, the light-emitting device package, which may reduce the color variation/dispersion between the light-emitting chips and increase productivity, may be manufactured.

In addition, some of the light-emitting chips 200 may be classified into chips capable of producing the target color C0 in the process of FIG. 7C. Thus, the light-emitting chips capable of producing the target color C0 may be separately collected, and then mounted on a substrate. In this case, the plurality of light-emitting chips 200 mounted on the substrate together with each other may also produce the target color C0.

Also, in the process of FIG. 7A, instead of forming a plurality of light-emitting cells 20 spaced from each other, one "light emitting structure layer" (stacked structure) may be formed, the light emitting structure layer may be divided into a plurality of light-emitting cells later. That is, a light emitting structure layer including a plurality of light-emitting cell regions may be formed. In this case, a fluorescent layer may be formed on the light emitting structure layer as a successive process. Then, the substrate on which the light emitting structure layer and the fluorescent layer are formed may be divided into a cell unit to form a plurality of light-emitting chips similar to those of FIG. 7B. Thereafter, the processes of FIGS. 7C and 7D may be performed.

Hereinafter, a color temperature relationship between the plurality of light-emitting chips 200a to 200d selected in the current embodiment and the target color C0 will be briefly described.

The plurality of light-emitting chips 200a to 200d selected in the current embodiment may have color temperatures within about ±250K of that of the target color C0. The fact that the plurality of light-emitting chips 200a to 200d have the color temperatures within about ±250K of that of the target color C0 may mean the fact that the color temperatures of the plurality of light-emitting chips 200a to 200d are within a MacAdam 7-step with respect to the target color C0. Color temperatures of light-emitting chips randomly selected in a typical process may be outside of the MacAdam 7-step with respect to a central color (i.e., target color). Also, since the color temperatures of the selected light-emitting chips in the typical process are randomly located in position, it may be difficult to secure superior quality. However, like the current embodiment, when the condition of the MacAdam 7-step, i.e., the condition in which the plurality of selected light-emitting chips have the color temperatures within, i.e., about ±250K of that of the target color C0 is satisfied, and when the plurality of selected light-emitting chips produce the colors around the target color C0, the superior quality may be easily obtained.

While the inventive concept has been particularly shown and described with reference to exemplary embodiments thereof, it will be understood by those of ordinary skill in the art that various changes in form and details may be made therein without departing from the spirit and scope of the inventive concept as defined by the following claims. For example, it is obvious to one of ordinary skill in the art that the structures of the light-emitting device packages and manufacturing methods thereof according to embodiments of the present invention may be variously modified. Also, the idea of the inventive concept may be equally applied to light-emitting devices producing different colors except for a white light-emitting device. Therefore, the scope of the inventive concept is defined not by the detailed description of the inventive concept but by the appended claims.

What is claimed is:

1. A light-emitting device package comprising:
a substrate; and
a plurality of light-emitting chips disposed on the substrate,
wherein the plurality of light-emitting chips produce colors around a target color, and the colors around the target color have the same hue as the target color and color temperatures different from that of the target color,
wherein the target color is produced by combinations of the colors of light emitted from the plurality of light-emitting chips, and
wherein the target color is in a first rank region, and at least one of the colors of light emitted from the plurality of light-emitting chips is outside of the first rank region.

2. The light-emitting device package of claim 1, wherein one of the colors of light emitted from the plurality of light-emitting chips is in a second rank region which is adjacent to the first rank region.

3. The light-emitting device package of claim 2, wherein another one of the colors of light emitted from the plurality of light-emitting chips is in a third rank region, the first rank region is between the second rank region and the third rank region.

4. The light-emitting device package of claim 1, wherein one of the colors of light emitted from the plurality of light-emitting chips has a color coordinate point above the first rank region.

5. The light-emitting device package of claim 4, wherein another one of the colors of light emitted from the plurality of light-emitting chips has a color coordinate point below the first rank region.

6. The light-emitting device package of claim 1, wherein the plurality of light-emitting chips have color temperatures within about ±250K of that of the target color.

7. The light-emitting device package of claim 1, wherein the target color is a color corresponding to a central portion of the first rank region.

8. The light-emitting device package of claim 1, wherein the plurality of light-emitting chips are arranged in an N×N matrix, where N is a natural number equal to or greater than two.

9. The light-emitting device package of claim 1, wherein the light-emitting device package is a white light-emitting device package.

10. A light-emitting device package comprising:
    a substrate; and
    a plurality of light-emitting chips disposed on the substrate,
    wherein the plurality of light-emitting chips produce colors around a target color, and the colors around the target color have the same hue as the target color and color temperatures different from that of the target color,
    wherein the target color is produced by combinations of the colors of light emitted from the plurality of light-emitting chips,
    wherein the colors of light emitted from the plurality of light-emitting chips includes first through fourth colors which have first through fourth color coordinate points, respectively,
    wherein a first line connecting the first and second color coordinate points and a second line connecting the third and fourth color coordinate points cross each other.

11. A method of manufacturing a light-emitting device package, the method comprising:
    forming a light emitting structure layer comprising a plurality of light-emitting cell regions on a wafer;
    forming a fluorescent layer covering the plurality of light-emitting cell regions on the wafer;
    separating the wafer on which the plurality of light-emitting cell regions and the fluorescent layer are formed into a cell unit to form a plurality of light-emitting chips;
    classifying the plurality of light-emitting chips according to color temperatures thereof; and
    selecting a plurality of chips among the plurality of light-emitting chips and packaging the selected light-emitting chips on a substrate,
    wherein the selected light-emitting chips produce colors around a target color, the target color is in a first rank region, and at least one of the colors from the selected light-emitting chips is outside of the first rank region.

12. The method of claim 11, wherein one of the colors from the selected light-emitting chips is in a second rank region which is adjacent to the first rank region.

13. The method of claim 12, wherein another one of the colors from the selected light-emitting chips is in a third rank region, the first rank region is between the second rank region and the third rank region.

14. The method of claim 11, wherein one of the colors from the selected light-emitting chips has a color coordinate point above the first rank region.

15. The method of claim 14, wherein another one of the colors from the selected light-emitting chips has a color coordinate point below the first rank region.

16. The method of claim 11, wherein the selected light-emitting chips have color temperatures within about ±250K of that of the target color.

17. The method of claim 11, wherein the target color is a color corresponding to a central portion of the first rank region.

* * * * *